(12) United States Patent
Lyu et al.

(10) Patent No.: US 10,134,788 B2
(45) Date of Patent: Nov. 20, 2018

(54) DUAL VPIN HDR IMAGE SENSOR PIXEL

(71) Applicant: OmniVision Technologies, Inc., Santa Clara, CA (US)

(72) Inventors: Jeong-Ho Lyu, San Jose, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 688 days.

(21) Appl. No.: 14/029,515

(22) Filed: Sep. 17, 2013

(65) Prior Publication Data

US 2015/0076330 A1    Mar. 19, 2015

(51) Int. Cl.
*H01L 31/00* (2006.01)
*H01L 27/146* (2006.01)
*H04N 5/355* (2011.01)
*H04N 5/3745* (2011.01)

(52) U.S. Cl.
CPC .. *H01L 27/14609* (2013.01); *H01L 27/14616* (2013.01); *H01L 27/14641* (2013.01); *H04N 5/3559* (2013.01); *H04N 5/37457* (2013.01)

(58) Field of Classification Search
CPC ......... H01L 27/14609; H01L 27/14641; H01L 27/14616; H04N 5/37457; H04N 5/3559
USPC ............................ 250/208.1, 214.1; 348/294
See application file for complete search history.

(56) References Cited

U.S. PATENT DOCUMENTS

| | | | |
|---|---|---|---|
| 5,625,210 A | 4/1997 | Lee et al. | |
| 6,727,946 B1 | 4/2004 | Zhao et al. | |
| 7,265,784 B1 | 9/2007 | Frank | |
| 7,483,058 B1 | 1/2009 | Frank et al. | |
| 7,626,626 B2 | 12/2009 | Panicacci | |
| 8,144,226 B2* | 3/2012 | Shah | H04N 5/37457 348/303 |
| 2004/0051801 A1* | 3/2004 | Iizuka | H01L 27/14609 348/294 |
| 2004/0096124 A1 | 5/2004 | Nakamura | |
| 2005/0110885 A1* | 5/2005 | Altice, Jr. | H04N 5/363 348/308 |
| 2006/0071254 A1 | 4/2006 | Rhodes | |
| 2006/0256221 A1 | 11/2006 | Mckee et al. | |
| 2007/0040922 A1 | 2/2007 | McKee et al. | |
| 2007/0063127 A1 | 3/2007 | Bock | |
| 2007/0206110 A1 | 9/2007 | Wada | |
| 2008/0018765 A1 | 1/2008 | Choi et al. | |
| 2009/0008532 A1 | 1/2009 | Setoguchi | |
| 2010/0182465 A1* | 7/2010 | Okita | H04N 5/343 348/273 |

(Continued)

OTHER PUBLICATIONS

Krymski, et al., "Estimates for scaling of pinned photodiodes," in Proc. IEEE Workshop CCD and Adv. Image Sens., 2005, 4 pages.
Liu, "The Design of a High Dynamic Range CMOS Image Sensor in 110nm Technology", Delft University of Technology, CMOSIS Image Sensors, Aug. 2012, 93 pages.

(Continued)

*Primary Examiner* — Georgia Y Epps
*Assistant Examiner* — Kevin Wyatt
(74) *Attorney, Agent, or Firm* — Lathrop Gage LLP

(57) ABSTRACT

A CMOS photodiode device for use in a dual-sensitivity imaging pixel contains at least two areas of differential doping. Transistors are provided in electrical contact with these areas to govern operation of signals emanating from the photodiode on two channels, each associated with a different sensitivity to light. A plurality of such photodiodes may be incorporate into a shared arrangement forming a single pixel, in order to enhance the signals.

14 Claims, 4 Drawing Sheets

(56) References Cited

U.S. PATENT DOCUMENTS

| | | | | |
|---|---|---|---|---|
| 2011/0205416 A1* | 8/2011 | Nishihara | ......... | H01L 27/14609 |
| | | | | 348/300 |
| 2012/0002089 A1* | 1/2012 | Wang | ................ | H01L 27/14603 |
| | | | | 348/297 |
| 2012/0132787 A1* | 5/2012 | Mabuchi | ................ | H04N 5/363 |
| | | | | 250/208.1 |
| 2012/0188427 A1* | 7/2012 | Solhusvik | ............ | H04N 5/3559 |
| | | | | 348/300 |
| 2012/0326008 A1* | 12/2012 | McKee | ............. | H04N 5/37452 |
| | | | | 250/208.1 |
| 2014/0077058 A1* | 3/2014 | Sakano | ............. | H01L 27/14612 |
| | | | | 250/208.1 |
| 2014/0239154 A1* | 8/2014 | Chen | ...................... | H04N 5/335 |
| | | | | 250/208.1 |

OTHER PUBLICATIONS

Kavadias, et al., "A Logarithmic Response CMOS Image Sensor With On-Chip Calibration", IEEE Journal of Solid State Circuits, vol. 35, No. 8, 1146-1152 (Aug. 2000).

Akahane, et al., "A Sensitivity and Linearity Improvement of a 100-dB Dynamic Range CMOS Image Sensor Using a Lateral Overflow Integration Capacitor", IEEE Journal of Solid State Circuits, vol. 41 No. 4, 851-858 (Apr. 2006).

Mase, et al. "A Wide Dynamic Range CMOS Image Sensor With Multiple Exposure-Time Signal Outputs and 12-bit Column-Parallel Cyclic A/D Converters", IEEE Journal of Solid-State Circuits, vol. 40 No. 12, 2787-2795 (Dec. 2005).

* cited by examiner

DUAL VPIN HDR IMAGE SENSOR PIXEL

BACKGROUND

Solid state image sensors include those incorporating complementary metal oxide semiconductor (CMOS) design. A photodiode-based pixel array collects opto-electrons for imaging purposes. The pixels are arranged in a row-column format that may, for example, be a 1280×800 array. Row processing circuitry and column processing circuitry operate by known methods to pre-process analog signals and convert the analog signals to digital signals. Low voltage differential signaling (LVDS) provides the final digital output stage. See for example U.S. Pat. No. 7,483,058 issued to Frank et al. and U.S. Pat. No. 7,265,784 issued to Frank.

Designs for competitive imaging technologies include those for charge-coupled device (CCD) and CMOS imaging sensors. These concepts originated in the 1960 and 1970's. While CCD technology achieved an early lead, CMOS is now emerging as the dominant technology. The rise of CMOS-based imaging technology is, in part, attributable to new processing technologies that reduce the size of solid state transistors (MOSFET). Smaller transistor sizes provide higher density, faster speed, lower power dissipation, and more functionality that can be integrated on a single chip. This densification is shown by way of example where in 1995 Jet Propulsion Laboratory produces the first successful active 128×128 pixel CMOS image sensor. The distance from pixel to pixel is known as the pixel pitch. The JPL device of 1995 had a pixel pitch of about 20 μm. This compares to current technologies that are capable of shrinking the pixel pitch down to about 1.2 μm in fully functional imaging devices; however, transistor size is no longer the limiting factor in achieving further scale reductions beyond about 1.2 μm.

Smaller pixel sizes problematically provide less photosensing area on the pixel itself. Each pixel is less sensitive to light where also the signal to noise ratio is disadvantageously reduced. These problems diminish the dynamic range that is achievable from each pixel. Various solutions have been proposed to address this problem, but each solution has its own problems. Logarithmic response pixels have been proposed to extend the dynamic range nonlinearly, as reported in Kavidas et al. "a Logarithmic Response CMOS Image Sensor With On-Chip Calibration" IEEE Journal of Solid State Circuits, Vol. 35, No. 8 pp. 1146-1152 (August 2000). This solution is problematic where the nonlinear response produces difficulty in reconstructing the final image. Another proposed solution is to provide a lateral overflow capacitor as reported in Akahane et al., "A Sensitivity and Linearity Improvement of a 100-dB Dynamic Range CMOS Image Sensor Using A Lateral Overflow Integration Capacitor" IEEE Journal of Solid State Circuits, Vol. 41 No. 7, pp. 1577-1587 (July 2008). This second solution problematically introduces a large variation in the threshold voltage of the transfer gates, and this may introduce additional 'dark' current leading to higher dark current imaging shot noise. Some have proposed adopting multiple exposure times to expand the dynamic range as reported in Mase et al. "A Wide Dynamic Range CMOS Image Sensor With Multiple Exposure-Time Signal Outputs and 12-bit Column-Parallel Cyclic A/D Converters" IEEE Journal of Solid-State Circuits, Vol. 40 No. 12 pp. 2787-2795 (December 2005). This third solution produces discontinuity in the signal-to-noise ratio, where also differing integration times may distort images due to motion.

As reported in U.S. Pat. No. 5,625,210 issued to Lee et al., pinned photodiodes may be incorporated into CMOS image sensors to improve the blue response, reduce image lag and minimize the dark current characteristics of active pixel sensors.

SUMMARY

The present disclosure mitigates the problems outlined above and advances the art by providing a photodiode device having multiple sensitivity to light conditions. The photodiode device is differentially doped to provide a plurality of channels each emanating a signal allocated to a particular light condition, such as bright light and low light conditions. The photodiode device may be incorporated within circuitry forming a pixel to enhance the dynamic range of the pixel, also with improvement of signal to noise ratio.

In one embodiment, a single photodiode device has multiple sensitivity to light conditions. A photoactive area is provided to convert light into photocurrent. A first channel includes a first dopant material affecting potential on the first channel. A first transistor is positioned to govern transfer of charge from the photoactive area into the first channel. A second channel includes a second dopant material affecting potential on the second channel to a different degree than the first dopant material affects potential on the first channel. A second transistor is positioned to govern transfer of charge from the photoactive area into the second channel. By these expedients, due to differences in the first dopant material and the second dopant material, the first channel as compared to the second channel is better suited for imaging conditions under one of a low light condition and a bright light condition.

In one aspect, the first dopant material and the second dopant material may reside in different regions of the photoactive area such that a first region of the photoactive area has an inherent material property of $V_{pin1}$ associated with the first dopant material on the first channel. The second region of the photoactive area then has an inherent material property of $V_{pin2}$ associated with the second dopant material on the second channel, such that $V_{pin1}$ has a greater magnitude than does $V_{pin2}$.

In one aspect, the photodiode device may be provided with circuitry incorporating the photodiode device in a pixel that uses the first channel to sense a bright light condition and the second channel to sense a low light condition.

In one aspect, the first transistor may have an internal threshold voltage $V_{t1}$ and the second transistor may have an internal threshold voltage $V_{t2}$, such that $V_{t1}$ is approximately equal to $V_{t2}$.

In one aspect, the pixel circuitry includes a transistor that is selectively actuable to isolate the first channel from the second channel, thus separating a signal on the second channel from a signal on the first channel.

In one aspect, the photodiode device may be incorporated in a pixel that shares a plurality of such photodiode devices.

According to one embodiment, the photodiode device contains the first dopant material residing in the first transistor and the second dopant material residing in the second transistor. Thus, the first channel has an increased internal threshold voltage $V_{ti}$ as compared to the second channel.

In one aspect, the pixel circuitry may include the first channel as a loop connected to the second channel downstream of the second transistor relative to the second area.

In one aspect, pixel circuitry is improved by use of the photodiode device with differential doping to provide a first channel producing a signal allocated to a first level of sensitivity to light and a second channel producing a signal allocated to a second level of sensitivity to light.

In one aspect, pixel circuitry is improved by use of a photoactive area feeding a plurality of channels, where a plurality of transistors each govern flow of accumulated charge from the photoactive area into a corresponding channel. Each transistor may be differentially doped with respect to the other transistors to produce a different voltage potential on each channel attributable to different internal threshold voltages of the respective transistors.

It will be appreciated that the foregoing device may be operated by: (1) resetting the photodiode device to a predetermined voltage; (2) turning off the first transistor and the second transistor by application of a gate voltage $V_{TX1}$ to the first transistor and a second gate voltage $V_{TX2}$ to the second transistor, where $V_{TX1}$ equals $V_{TX2}$; (3) impinging light upon the photodiode device to produce an accumulated charge; and (4) switching on at least one of the first transistor and the second transistor to allow charge to flow from the photodiode device.

Definitions

As used herein, the term "internal threshold voltage" or $V_{ti}$ is an inherent property of a solid state transistor constituting a voltage that is required for current to flow across the transistor.

Pin voltage or $V_{pin}$ means an inherent property of a photodiode that exists as a voltage upon full depletion of what the art alternatively refers to as the depletion region, photoconversion region, photo collection region or photo sensitive region of a photodiode. This depletion region exists at a boundary between n-doped and p-doped regions and is where photons excite immobile electrons into a mobile state where the electrons can move to one side to reduce the voltage induced on the photodiode during its reset sequence.

DETAILED DESCRIPTION

Figure 1:
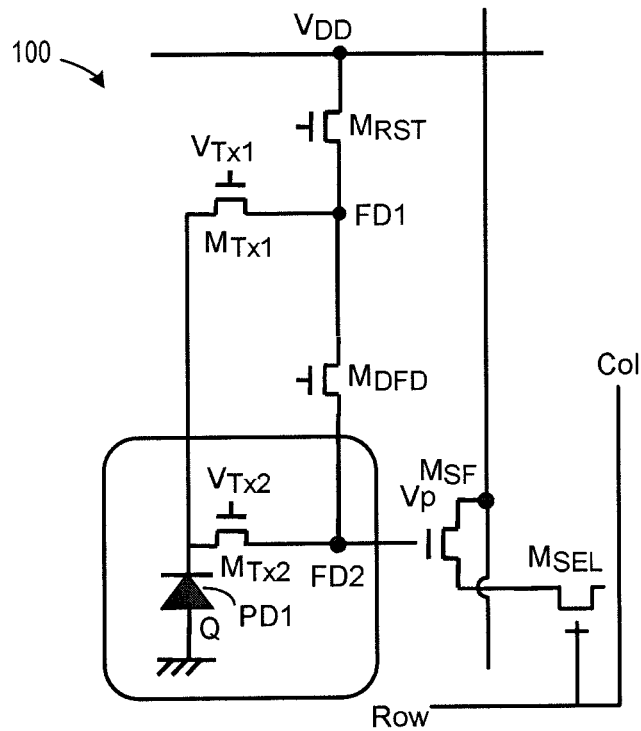
FIG. 1 is a schematic circuit diagram of a CMOS based dual-sensitivity pixel incorporating a photodiode device that is differentially doped to provide multiple channels of different sensitivity to light.

FIG. 1 is a schematic circuit diagram showing an improvement constituting a dual sensitivity pixel 100 demonstrating wide dynamic range performance. A photodiode device PD1 is used to generate a charge or photocurrent Q. Transistors $M_{Tx1}$ and $M_{Tx2}$ control dissipation of the charge Q for image sense operations such that a closed state of $M_{Tx1}$ acting as a switch feeds a first channel designated as node FD1, and a closed state of $M_{Tx2}$ acting as a switch feeds a second channel designated as node FD2. Transistor $M_{DFD}$ may be opened or closed by varying the applied voltage $V_{DFD}$ for selective isolation of node FD1 from node FD2. Transistor $M_{SF}$ is a readout transistor acting as a source-follower buffer that accumulates pixel voltage $V_P$ arising from the charge Q and permits readout or observation of this voltage $V_P$ without necessarily removing the accumulated charge. A reset transistor $M_{RST}$ may be closed for reset of the dual sensitivity pixel 100 by clearing all integrated charge when transistors $M_{Tx1}$ and $M_{Tx2}$ are also closed. Transistors $M_{RST}$ and $M_{SF}$ are connected to power supply voltage $V_{DD}$. Transistor $M_{SEL}$ permits readout of a single ROW of the pixel array during sense operations. Node FD1 forms a loop that discharges into node FD2 at a position downstream of transistor $M_{Tx2}$ relative to the photodiode PD1.

It will be appreciated from the context of FIG. 1 that voltages $V_{Tx1}$ and $V_{Tx2}$ may be provided at different levels to achieve different levels of sensitivity from the single photodiode device PD1, respectively, in nodes FD1 and FD2. However, according to the various embodiments discussed below, different levels of sensitivity may also exist due to differential doping of the photoactive area of the photodiode device PD1. This permits the voltages $V_{Tx1}$ and $V_{Tx2}$ to be the same, which is preferred according to one such embodiment.

$V_{Tx1}$ and $V_{Tx2}$ may be set to a common value while voltage properties inherent to the photodiode PD1 and/or transistors $M_{Tx1}$ and $M_{Tx2}$ create different channels within the photodiode device PD1. These concepts as applied to FIG. 1 are expanded in the discussion below.

Figure 2:
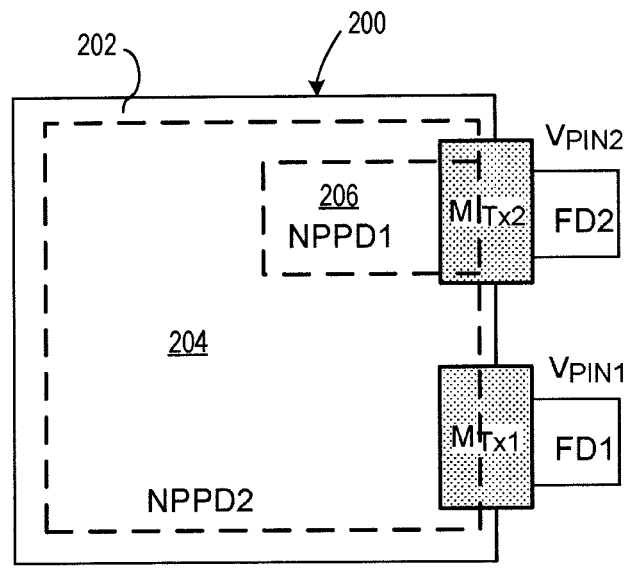
FIG. 2 shows a photodiode device according to one embodiment that includes differentially doped areas to differentiate PIN voltage or $V_{pin}$ properties of the photodiode material respectively allocated to the different channels.

FIG. 2 shows how to apply two voltages to govern current flow from the same photodiode device 200, which constitutes the photodiode device PD1 of FIG. 1 according to one embodiment. FIG. 2 retains like numbering of identical parts with respect to FIG. 1. The photodiode device 200 may include a substrate 202 and a first doped region 204 with n and p doping that provides carrier mobility for the transport of electrons and holes resulting in photocurrent during the presence of incident light. The gate voltage $V_{Tx1}$ is applied for control of current through transistor $M_{Tx1}$ as shown in FIG. 1. Scaled doping of solid state photodiodes to produce the same or different charge generation performance is known to the art. In region 206, the n and p doping differs from that of region 204 to produce a different photocurrent response under incident light. Gate voltage $V_{TX2}$ is applied to control the flow of current through transistor $M_{TX2}$. In this embodiment of FIG. 2, the gate voltages $V_{TX1}$ and $V_{TX2}$ are preferably the same, although these voltages may also differ from one another. The differential doping of regions 204, 206 produce different photocurrent responses in the photodiode PD1. These responses may, for example, be respectively allocated for imaging under a bright light condition versus a low light condition, as will be explained more completely below. In this embodiment, the surface area footprint of region 204 feeding node FD1 is advantageously much larger, such as more than five times or even ten times larger, than the footprint of region 206. This provides a greater surface area for collection of low light condition optoelectronic charges from light impinging upon region 204, while also presenting less surface area for collection of bright light feeding node FD2.

Figure 3:
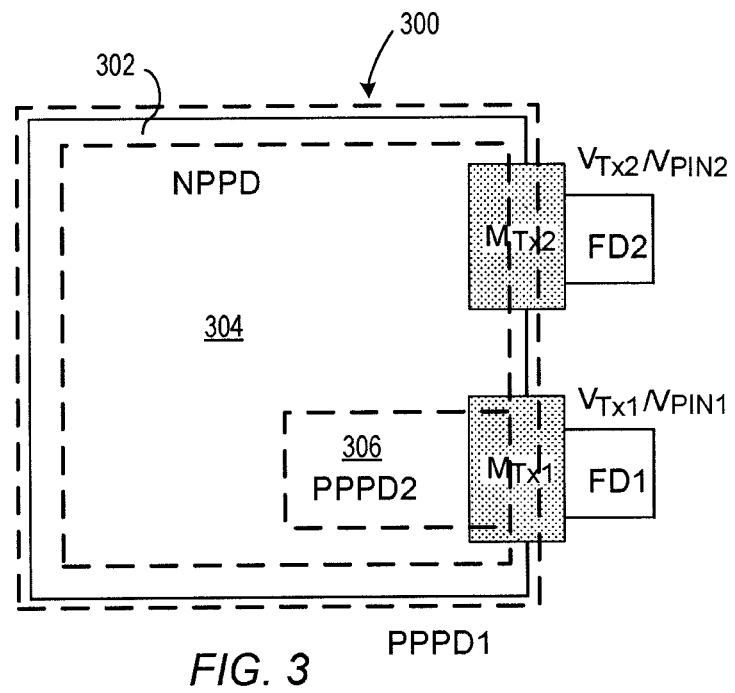
FIG. 3 shows a photodiode device according to one embodiment that includes differentially doped areas to differentiate $V_{pin}$ properties of the photodiode material respectively allocated to the different channels.

FIG. 3 depicts another embodiment concerning how to achieve different current levels from different portions of the same photodiode device 300, which for example may constitute the photodiode device PD1 of FIG. 1 according to one embodiment. FIG. 3 retains like numbering of identical parts with respect to FIG. 1. The photodiode device 300 contains a substrate 302 that is provided with regions 304, 306 that differ from one another in the amount of n and p doping to produce different photocurrent responses under conditions of ambient light. Region 304, is for example a lightly p-type doped substrate. $V_{TX1}$ as applied to $M_{TX1}$ controls delivery of photocurrent through node FD1, and $V_{TX2}$ controls delivery of photocurrent through transistor $M_{TX2}$.

The differential doping of regions 304, 306 produce different photocurrent responses in the photodiode PD1. These responses may, for example, be respectively allocated for imaging under a bright light condition versus a low light condition, as will be explained more completely below. In this embodiment, the surface area footprint of region 304 feeding node FD1 is advantageously much larger, such as more than five times or even ten times larger, than the footprint of region 306. This provides a greater surface area for collection of low light condition optoelectronic charges from light impinging upon region 304, while also presenting less surface area for collection of bright light feeding node FD1.

Figure 4:
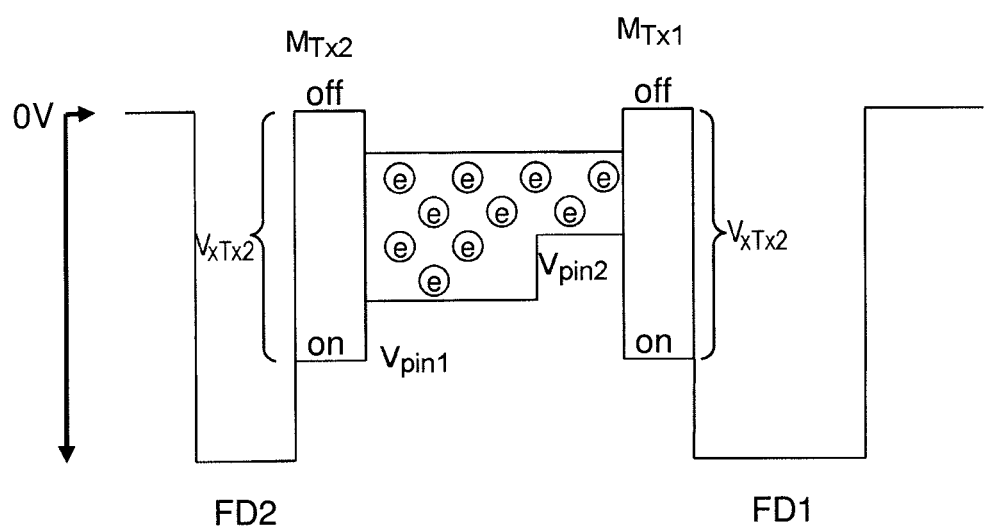
FIG. 4 is a voltage diagram that describes operation of the $V_{pin}$-based voltage embodiments.

FIG. 4 shows, by way of example, operation of the dual sensitivity pixel 100 in various portions of FIG. 1 where the voltages $V_{pin1}$ and $V_{pin2}$ are achievable by either the embodiment of photodiode device 200 or photodiode device 300. The voltage $V_{pin1}$ constitutes an inherent property of the photodiode PD1 in region 204 or 306 as the case may be (see FIGS. 2 and 3). The voltage $V_{pin2}$ constitutes an inherent property of the photodiode PD1 in region 206 or 304 as the case may be (see FIGS. 2 and 3). The photodiode devices 200, 300 are operated in reverse bias mode. The gate voltages $V_{TX1}$ and $V_{TX2}$ as applied to place the transistors $M_{TX1}$ and $M_{TX2}$ in respective states of "off" preventing the flow of photocurrent current or "on" permitting the flow of photocurrent. Photocurrent generated from regions 204 or 306 will flow through transistor $M_{TX1}$ where $V_{TX1}$ exceeds $V_{pin1}$. Photocurrent generated from regions 206 or 304 will flow through transistor $M_{TX2}$ where $V_{TX2}$ exceeds $V_{pin2}$. The channel potential through FD1 is increased by having a greater $V_{pin1}$, such that channel FD2 is the preferred channel for low light imaging conditions.

The photodiode PD1 may be reset to voltages that are limited by the internal properties of $V_{pin1}$ and $V_{pin2}$ to other values corresponding to $V_{TX1}$ and $V_{TX2}$. Photocharges are generated by photons entering the space and collect until transistors $M_{TX1}$ and $M_{TX2}$ turn "on." FD1 and FD2 may also be reset to a voltage that is the same or greater than $V_{TX1}$ and $V_{TX2}$. When the transistors $M_{TX1}$ and $M_{TX2}$ turn "on," the charges flow to FD1 and/or FD2, which by design have a deeper potential well than does PD1. FD1 and FD2 may be designed such that their charge holding capacities matches their partner regions 204, 206, 304, 306 of PD1.

The node FD2 may be exposed to the voltage on node FD1 by turning "on" the transistor $M_{DFD}$ (see FIG. 1), in which case the voltage on node FD1 equals the voltage on node FD2 as shown in FIG. 4. Different voltages between nodes FD1 and FD2 may exist when transistor $M_{DFD}$ is "off."

Figure 5:
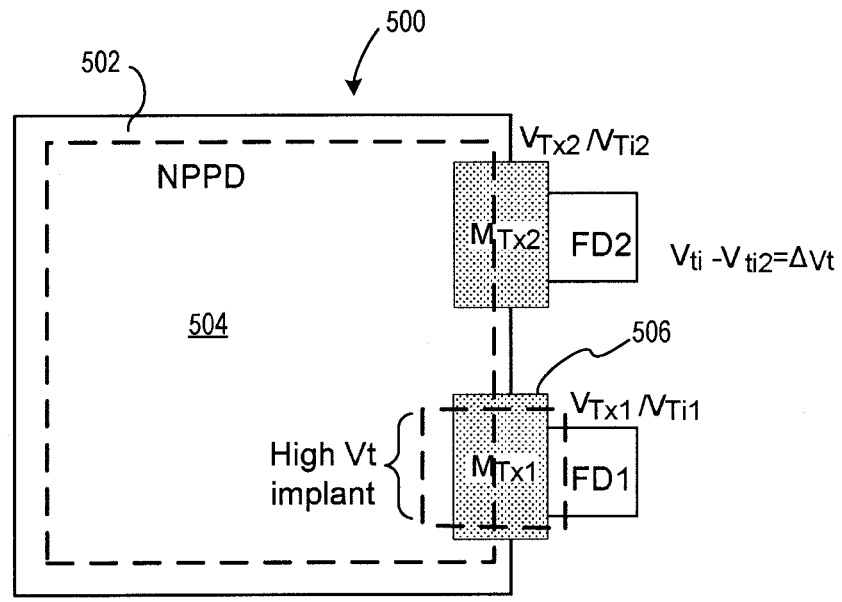
FIG. 5 shows a photodiode device according to one embodiment that includes differentially doped areas to differentiate internal threshold voltage or $V_{ti}$ properties of transistors that are respectively provided for control of signals emanating on the different channels.

FIG. 5 shows yet another embodiment of photodiode device PD1 as photodiode device 500. This embodiment does not require use of different $V_{pin}$ properties on nodes FD1 and FD2, but uses instead different internal threshold voltages (Vti) in the transistors $M_{Txt1}$, $M_{Txt2}$. On substrate 502, region 504 is lightly doped with p-type material that produces an internal threshold voltage property $V_{ti2}$ inherent to transistor $M_{TX2}$. Region 506 is doped with a material that increases $V_{ti1}$ in in transistor $M_{TX1}$. $V_{pin}$ is the same for all of region 504 and does not differ in the photodiode device 500. The channel potential of FD1 is increased by the implantation in region 506 that raises $V_{ti1}$ above $V_{ti2}$. Thus, channel FD2 is preferred for low light imaging conditions where $V_{TX1}$ and $V_{TX2}$ may be equal and the quantity $\Delta V_{ti}$, which is the increase in internal threshold voltage due to the high $V_{ti}$ implantation of region 506, increases the potential on channel FD1.

Figure 6:
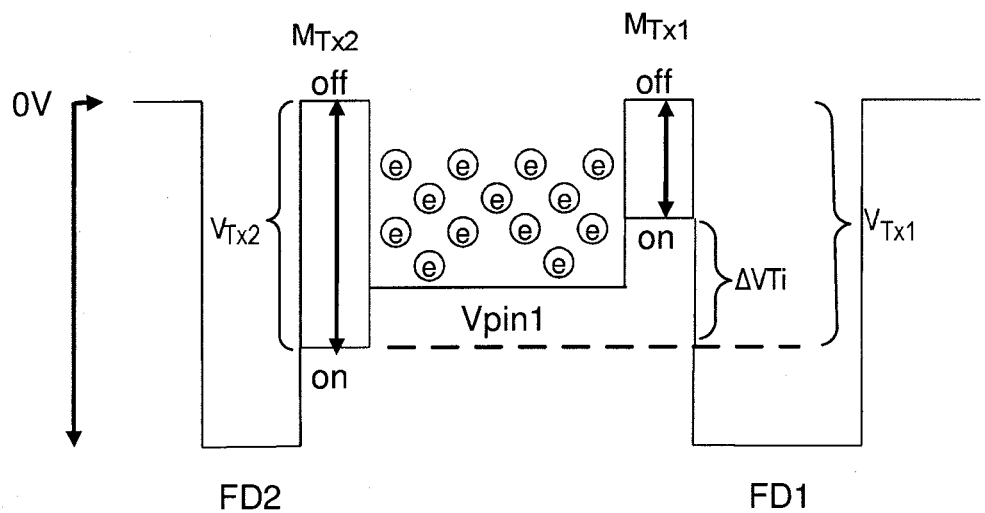
FIG. 6 is a voltage diagram that describes operation of the $V_{ti}$-based voltage embodiments.

FIG. 6 shows, by way of example, operation of the dual sensitivity pixel 100 where the potential of channels FD1, FD2 vary by higher $V_{ti}$ implantation in region 506 when using the embodiment of photodiode device 500 as PD1 (see FIG. 1). Gate voltages $V_{TX1}$ and $V_{TX2}$ may be equal to one another and selectively applied to turn "on" or "off" the corresponding gate transistors $M_{TX1}$, $M_{TX2}$. It will be appreciated that $V_{pin1}$ presents an additional hurdle to carrier mobility since the quantity $V_{TX1}+\Delta V_{ti}<V_{TX2}$, and so the channel FD2 is preferred for imaging in low light conditions.

Figure 7:
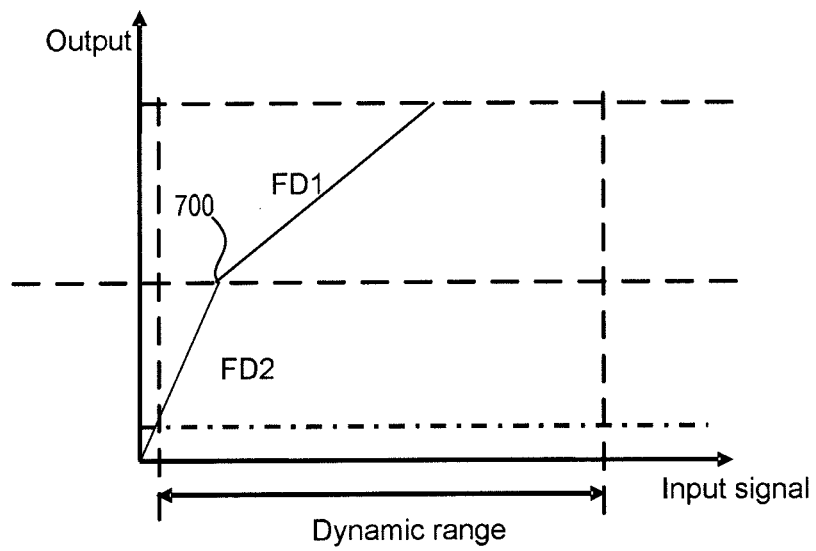
FIG. 7 shows operation of a pixel incorporating the photodiode device on a first channel FD1 allocated to bright light signal and a second channel FD2 allocated to low light signal.

FIG. 7 shows operation of the dual sensitivity pixel 100, generally speaking, according to the various embodiments described above. The signal in node FD2 may represent information from the low light or dark signal alone until such point 700 as the bright light signal on node FD1 becomes active.

Figure 8:
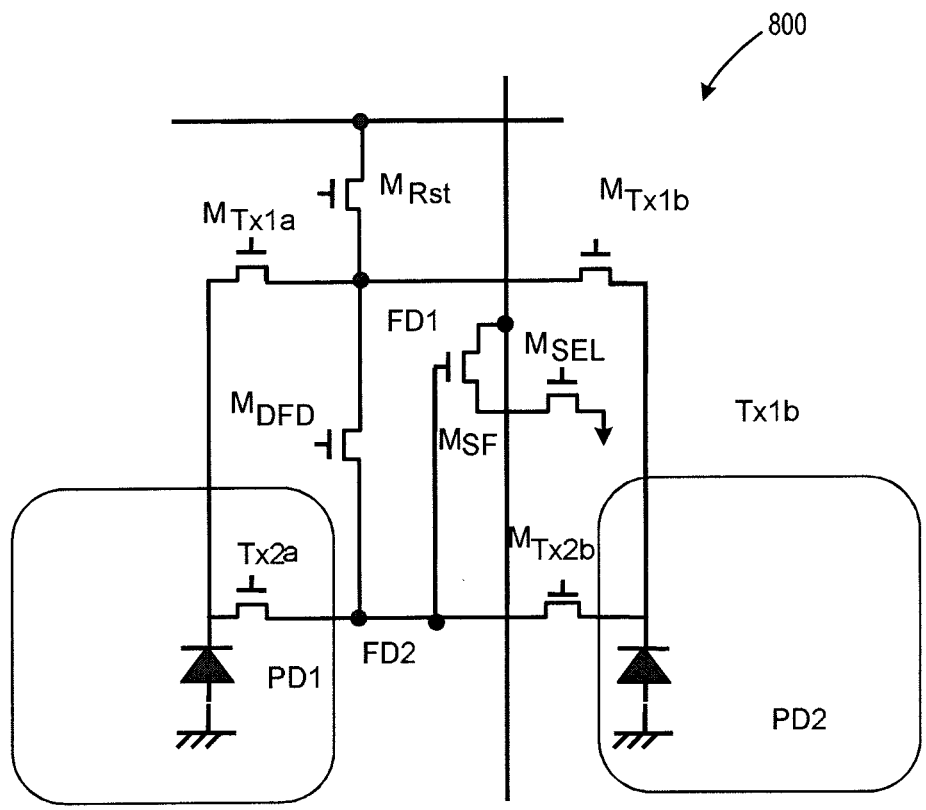
FIG. 8 shows a two-share arrangement incorporating a plurality of photodiode devices in a single pixel.

FIG. 8 shows a pixel 800 including a two-shared arrangement including photodiodes PD1 and PD2. FIG. 8 retains like numbering of identical circuit elements with respect to FIG. 1. Here the photodiode device PD2 may be one according to any of the photodiode devices 200, 300, 500. The photodiode device PD1 may be the same as or different from photodiode device PD2. Where PD1 and PD2 are the same, there is amplification of the output signal on the bright light or dark signal channels due to dual input. Where PD1 and PD2 are different, there are then four channels each having different sensitivities. Transistors $M_{Tx1a}$ and $M_{Tx2a}$ correspond to transistors $M_{Tx1}$ and $M_{Tx2}$ as described above with respect to photodiode devices 200, 300, 500, where the "a" subscript indicates use with PD1. Similarly, transistors $M_{Tx1b}$ and $M_{Tx2b}$ correspond to transistors $M_{Tx1}$ and $M_{Tx2}$ as described with respect to photodiode devices 200, 300, 500, where the "b" subscript indicates use with PD2.

The foregoing specification teaches by way of example and not by limitation. Accordingly, the claims should not be read as being unduly narrowed by the disclosure of the specification. Those skilled in the art will appreciate that what is shown and described may be subjected to insubstantial changes without departing from the scope and spirit of what is claimed. For this reason, the inventors hereby state their intention to rely upon the Doctrine of Equivalents to protect their full rights in the invention.

We claim:

1. A photodiode device having multiple sensitivity to light conditions, comprising:
   a first doped region and a second doped region formed within a common photoactive area region, the common photoactive area being a single photoconversion region adapted to provide photocurrent to both the first doped region and the second doped region; the first and second doped region being directly adjacent or overlapping in the common photoactive area;

a first transistor positioned to govern transfer of charge from the first doped region of the photoactive area, the first transistor electrically coupled to a first diffusion (FD1) node;
a second transistor positioned to govern transfer of charge from the second doped region of the photoactive area into a second diffusion (FD2) node; and
an isolation transistor electrically coupled between the FD1 node and the FD2 node for selectively coupling the FD1 node to the FD2 node,
a single source follower transistor adapted to serve for reading charge from the FD2 node or charge from the FD1 and FD2 nodes when the FD1 and FD2 node are coupled together;
whereby due to differences in a first doping of the first doped region of the photoactive area and a second doping of the second doped region of the photoactive area:
   the first doped region of the photoactive area as compared to the second doped region of the photoactive area is better suited for imaging conditions under one of a low light condition and a bright light condition,
   the first doped region of the photoactive area has an inherent pin voltage material property of $V_{pin1}$ associated with the first doping, and
   the second doped region of the photoactive area has an inherent pin voltage material property of $V_{pin2}$ associated with the second doping,
   such that $V_{pin1}$ differs from $V_{pin2}$.

2. The photodiode device of claim 1, further including circuitry incorporating the photodiode device in a pixel that uses the first transistor to sense a bright light condition and the second transistor to sense a low light condition.

3. The photodiode device of claim 2, wherein the first transistor has an internal threshold voltage $V_{t1}$ and the second transistor has an internal threshold voltage $V_{t2}$, such that $V_{t1}$ is approximately equal to $V_{t2}$.

4. The photodiode device of claim 3, further comprising means for resetting a charge accumulation state of the pixel.

5. The photodiode device of claim 3, further comprising means for sensing a charge accumulation state of the pixel.

6. The photodiode device of claim 2 incorporated in a pixel that shares a plurality of such photodiode devices.

7. The photodiode device of claim 1, wherein
the first doping resides in the first transistor and the second doping resides in the second transistor such that the first transistor has an increased internal threshold voltage Vt as compared to the second transistor.

8. The photodiode device of claim 7, further including circuitry incorporating the photodiode device in a pixel that uses the first transistor to sense a bright light condition and the second transistor to sense a low light condition.

9. The photodiode device of claim 7 incorporated in a pixel that shares a plurality of such photodiode devices.

10. The photodiode device of claim 1 incorporated in a pixel that shares a plurality of such photodiode devices.

11. The photodiode device of claim 1, further including circuitry providing the photodiode device with means for using the first region of the photoactive area to sense a bright light condition and means for using the second region of the photoactive area to sense a low light condition.

12. A method of operating the photodiode device of claim 1, including the steps of:
resetting the photodiode device to a predetermined voltage;
turning off the first transistor and the second transistor by application of a gate voltage $V_{TX1}$ to the first transistor and a second gate voltage $V_{TX2}$ to the second transistor, where $V_{TX1}$ equals $V_{TX2}$;
impinging light upon the photodiode device to produce an accumulated charge;
switching on at least one of the first transistor and the second transistor to allow charge to flow from the photodiode device.

13. In a CMOS pixel, the improvement comprising
a differentially doped photodiode constructed and arranged through associated circuitry to provide a first channel producing a signal allocated to a first level of sensitivity to light and a second channel producing a signal allocated to a second level of sensitivity to light, the first channel electrically coupled to a first floating diffusion (FD1) node via a first transistor, the second channel electrically coupled to a second floating diffusion (FD2) node via a second transistor, the FD1 node selectively coupled to the FD2 node by an isolation transistor, and a single source follower transistor adapted to serve for reading charge from the FD2 node or charge from the FD1 and FD2 nodes when the FD1 and FD2 node are coupled together;
wherein the photodiode comprises a first doping and the second doping residing in a first and a second region of its common photoactive area respectively such that:
the first region of the photoactive area has an inherent pin voltage material property of Vpin1 associated with the first doping and corresponds to the first channel,
the second region of the photoactive area has an inherent pin voltage material property of Vpin2 associated with the second doping and corresponds to the second channel,
such that Vpin1 has a different magnitude than Vpin2, and
the common photoactive area is a single photoconversion region adapted to provide photocurrent to both the first and second regions of the photoactive area, the first and second doped region being directly adjacent or overlapping in the common photoactive area; and the first and second doped region being directly adjacent or overlapping in the common photoactive area.

14. In a CMOS pixel, the improvement comprising
a common photoactive area feeding a plurality of channels, the common photoactive area being a single photoconversion region adapted to provide photocurrent to each of the plurality of channels;
a plurality of transistors each governing flow of accumulated charge from the common photoactive area into a corresponding channel of the plurality of channels,
each of the plurality of transistors being differentially doped with respect to the other transistors to produce a different voltage potential on each channel attributable to different internal threshold voltages of the respective transistors,
a first transistor of the plurality of transistors being electrically coupled directly between the photoactive area and a first floating diffusion (FD1) node,
a second transistor of the plurality of transistors being electrically coupled directly between the photoactive area and a second floating diffusion (FD2) node, and
the FD1 node being selectively isolatable from the FD2 node by an isolation transistor;
wherein a first region of the photoactive area has a first doping and a second region of the photoactive area has a second doping such that:
the first region of the photoactive area has an inherent pin voltage material property of Vpin1 associated with the first doping, and the second region of the photoactive area has an inherent pin voltage material property of Vpin2 associated with the second doping, such that Vpin1 has a different magnitude than does Vpin2, the first and second region being directly adjacent or overlapping in the common photoactive area.

* * * * *